(12) United States Patent
Matthews et al.

(10) Patent No.: US 6,459,276 B1
(45) Date of Patent: Oct. 1, 2002

(54) ROTOR ANALYZER FOR AN INDUCTION MOTOR

(75) Inventors: Michael D. Matthews, Lexington, KY (US); Brian T. Sullivan, La Crosse, WI (US); Henry G. Lenz, Scotia, NY (US)

(73) Assignee: American Standard Inc., Piscataway, NJ (US)

( * ) Notice: Subject to any disclaimer, the term of this patent is extended or adjusted under 35 U.S.C. 154(b) by 0 days.

(21) Appl. No.: 09/631,075

(22) Filed: Aug. 2, 2000

(51) Int. Cl.[7] ............................................. G01R 31/02
(52) U.S. Cl. ...................................... 324/545; 324/772
(58) Field of Search ................................ 324/772, 545, 324/240, 241; 310/114, 126

(56) References Cited

U.S. PATENT DOCUMENTS

| | | | | |
|---|---|---|---|---|
| 3,751,698 A | * | 8/1973 | Walker | 310/126 |
| 3,875,511 A | | 4/1975 | Sims | |
| 3,903,808 A | * | 9/1975 | Foldes | 104/288 |
| 4,692,701 A | * | 9/1987 | Dundas et al. | 324/240 |
| 4,808,932 A | * | 2/1989 | Schulz et al. | 324/545 |

* cited by examiner

Primary Examiner—N. Le
Assistant Examiner—Vincent Q. Nguyen
(74) Attorney, Agent, or Firm—William J. Beres; William O'Driscoll

(57) ABSTRACT

A rotor analyzer for an induction motor or generator checks and quantifies the integrity of a rotor that is not currently installed within its stator. The analyzer includes an electromagnetic coil that exposes the bars of a rotor to a pulsating magnetic field to induce a current through the bars. At the same time, the rotor is slowly rotated to sequentially expose each bar. A magnetic field created by the induced current in the bars induces an analog signal within a search coil. The analog signal is converted to digital and inputted to a microprocessor system. The system interprets the input data and manipulates it to provide a clear, understandable indication of the rotor's condition, such as the relative impendence of each bar. The system also determines how many bars are within a rotor having an unknown number of bars.

15 Claims, 2 Drawing Sheets

ROTOR ANALYZER FOR AN INDUCTION MOTOR

BACKGROUND OF THE INVENTION

1. Field of the Invention

The subject invention generally pertains to induction motors and generators, and more specifically to nondestructive testing of their rotors.

2. Description of Related Art

Induction motors typically include a rotor that rotates in response to a rotating magnetic flux generated by alternating current in a stator associated with the rotor. A rotational speed differential (known as "slip") between the rotor and the rotating flux induces a current through a rotor cage. A rotor cage typically consists of a single aluminum casting having several conductive bars that run axially through the rotor and are joined at each end by two conductive end rings. Current induced in the bars creates a magnetic flux that opposes that of the stator, thus providing the rotor with rotational torque.

Sometimes it is desirable to inspect the integrity of a rotor before a new motor is assembled or before considering its use in a rebuilt motor. It is especially valuable to know the impedance of each rotor bar to identify rotor faults such as a cracked bar, separation between a bar and an end ring, or porosity of a bar and/or end ring. However, inspecting and identifying such faults is difficult to do, as cast aluminum cages are often cast directly into a laminated steel core of the rotor.

To provide a nondestructive test for rotors, an apparatus and method disclosed in U.S. Pat. No. 3,875,511 exposes a rotating rotor to what appears to be a constant magnetic field provided by an electromagnetic sending coil. The rotor bars crossing the magnetic lines of flux induce a current through the bars. A receiving coil detects the induced current to provide an analog signal that can be displayed on an oscilloscope.

An analog display, however, can be difficult to interpret and quantify. For example, in some cases the spacing between adjacent bars is so close that the spikes or peaks of an analog signal may tend to run together, thus making it difficult to distinguish one spike or bar from another. Similar negative results may occur when the bars are slightly recessed below the outer periphery of the laminated core. In such cases, portions of the core overlaying a bar may adversely shield the bar from a sending or receiving coil, and thus reduce the amplitude of the sensed signal. Also, when the bars are hidden below the outer surface of the core, a simple analog display may not provide a clear indication of how many bars are actually in the rotor. Manufacturers of new rotors will, of course, know how many bars are in their own rotors; however, for those that rebuild motors manufactured by others, the number of bars may be unknown.

With an analog display, electrical noise or a stray spike could be misinterpreted as another bar. Moreover, with an analog display, it can be difficult to establish the repeatability of the readings. Repeatability or comparison of one set of readings to a later one can be valuable not only to establish the credibility of a particular set of readings, but also to determine whether a rotor is deteriorating over an extended period of use.

SUMMARY OF THE INVENTION

To quantify the integrity of a rotor of an induction motor or generator, it is an object of the invention to nondestructively create a digital signature that indicates the impedance of each bar of the rotor.

Another object of the invention is to repeatedly check the impedance of each bar of a rotor to establish a credible record of the rotor's integrity.

Another object is to create and store a digital record that indicates the integrity of a rotor, and later reference that record to determine the extent that the rotor may have deteriorated over an extended period of operation.

Another object is to determine the number of bars in a rotor by sequentially sensing the impedance of each bar for more than a full revolution of the rotor to create a repeating pattern that indicates that every bar has been checked at least once.

A further object of the invention is to create digital raw data that indicates the impedance of a rotor's bars, and to manipulate the data by way of a microprocessor to create an enhanced visual indication of the impedance of each rotor bar.

A still further object is to induce an electrical current in a rotor by varying the current in an electromagnetic sending coil.

Another object is to sense the current through an electromagnetic sending coil to acquire an indication of a rotor bar's impedance.

Yet another object is to sense the current or voltage of electromagnetic receiving coil to acquire an indication of a rotor bar's impedance.

Another object is to distinguish one fault from another, wherein one fault is one or more bars having impedance that exceeds a predetermined limit, and another fault is a pattern of gradually varying impedance or a number of bars of especially high impedance being unequally distributed around the rotor.

These and other objects of the invention are provided by rotor analyzer that exposes the bars of a rotor to a varying magnetic field to induce a current through the bars. A digital signal is created that varies as a function of the induced current. A microprocessor manipulates the digital signal to provide an enhanced visual indication of the impedance of each rotor bar.

BRIEF DESCRIPTIONS OF THE DRAWINGS

DESCRIPTION OF THE PREFERRED EMBODIMENT

Figure 1:
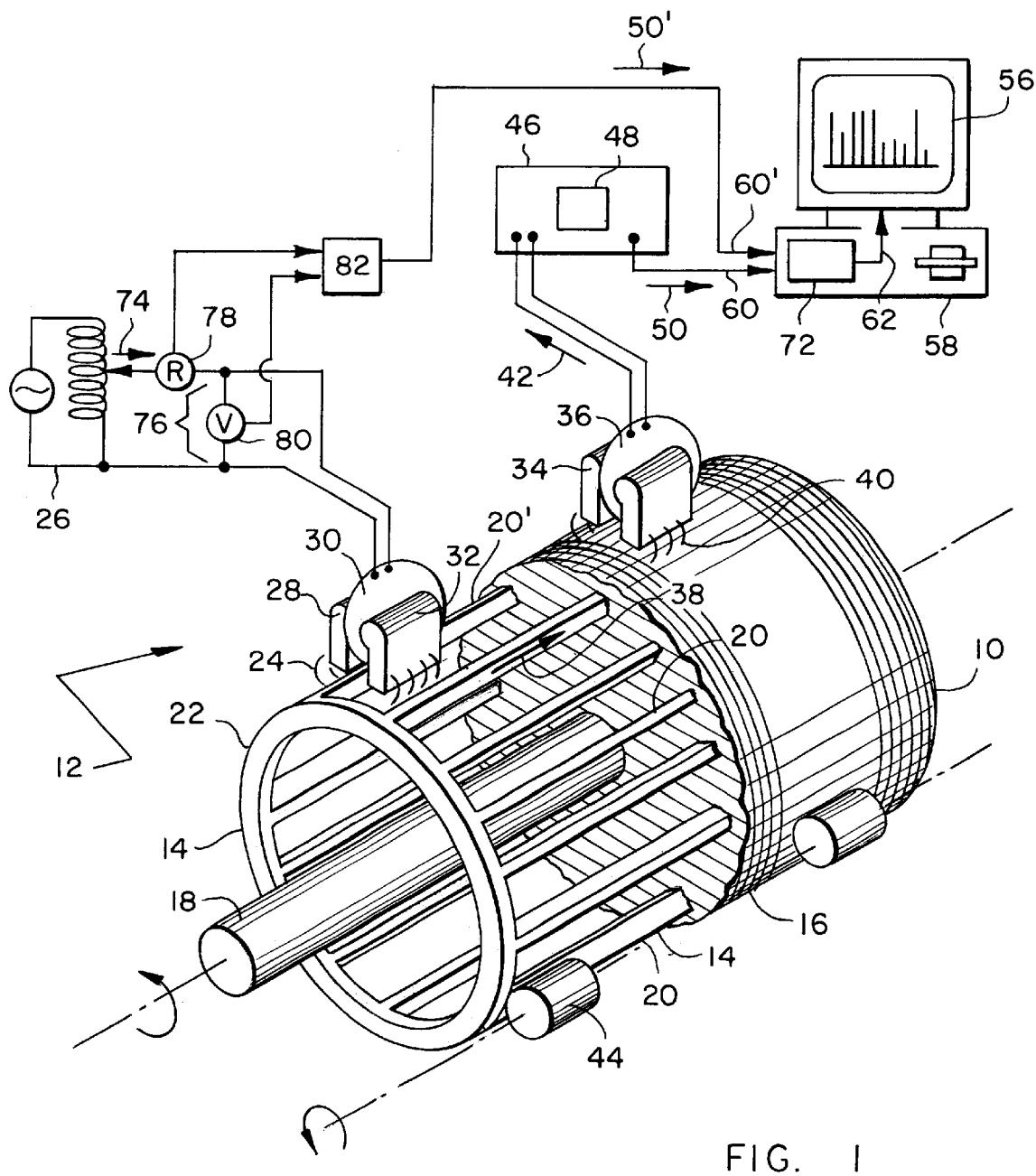
FIG. 1 is a perspective cut-away view of a rotor being tested by an exemplary embodiment of a rotor analyzer with some portions of the analyzer being schematically illustrated.

Referring to FIG. 1, a rotor 10 is shown in the process of being nondestructively tested by a rotor analyzer 12. In this example, rotor 10 includes an aluminum cage 14 integrally cast within a rotor core 16 made of a stack of laminated steel sheets. A rotor shaft 18 is keyed, welded, and/or otherwise fixed to laminated core 16. Rotor cage 14 includes several electrically conductive bars 20 that extend between two opposing end rings 22.

To check the resistance, impedance, porosity, or other characteristic that reflects the integrity of bars 20 and their connection with rings 22, analyzer 12 exposes rotor 10 to a varying magnetic field 24. This can be accomplished in number of ways, however, in a preferred embodiment a power supply, such as a variac 26 applies an alternating voltage (e.g., 20 to 40 volts, 60 Hz) across an electromagnetic excitation coil 28 to create field 24. As an alternative, it may also be possible to create an effective varying magnetic field from a pulsating DC voltage or from a moving magnet (oscillating or rotating). Excitation coil 28, in this example, includes windings 30 of about 300 turns of film-insulated, 19-gage wire wrapped around a preferably U-shaped, laminated steel core 32.

Excitation coil 28 is placed near one end of rotor core 16, while a search coil 34 is positioned near an opposite end. Search coil 34 includes windings 36 having about 400 turns of 20-gage wire and is otherwise similar in construction to coil 28. The actual positioning and mounting of coils 28 and 34 can be provided by any of a variety of conventional brackets or support structures. Regardless of the chosen mounting structure, the ends of the U-shaped core of coils 30 and 36 are preferably spaced just a few thousandths of inch (e.g., 0.010 inches) away from the surface of rotor 10. This spacing can be an air gap or can be taken up by some sort of spacer of a non-ferromagnetic material, such as a plastic bearing pad. Although the actual spacing is not critical, preferably the spacing remains substantially constant throughout the testing process of analyzer 12.

In operation, varying magnetic field 24 of excitation coil 28 induces a varying electrical current 38 through a first bar 20'. The other bars 20 and end rings 22 complete the electrical circuit for current 38. Current 38 in bar 20' creates a secondary magnetic field 40 that induces an electrical signal 42 in windings 36 of search coil 34. At the same time, a drive unit 44 (e.g., a set of powered rollers) slowly rotates rotor 10 at about one or two revolutions per minutes relative to coils 28 and 34. The relative rotation could alternatively be achieved by having coils 28 and 34 revolve while rotor 10 is held stationary. Either way allows current 38 to be generally sequentially induced in each bar 20. Although, with closely spaced bars 20 and a relatively wide excitation coil 28, there may be some overlap, whereby some of current 38 is actually induced in a bar adjacent to bar 20'. Thus, the inducing of current 38 through each of bars 20 is not necessarily done in sequence or simultaneously.

Figure 2:
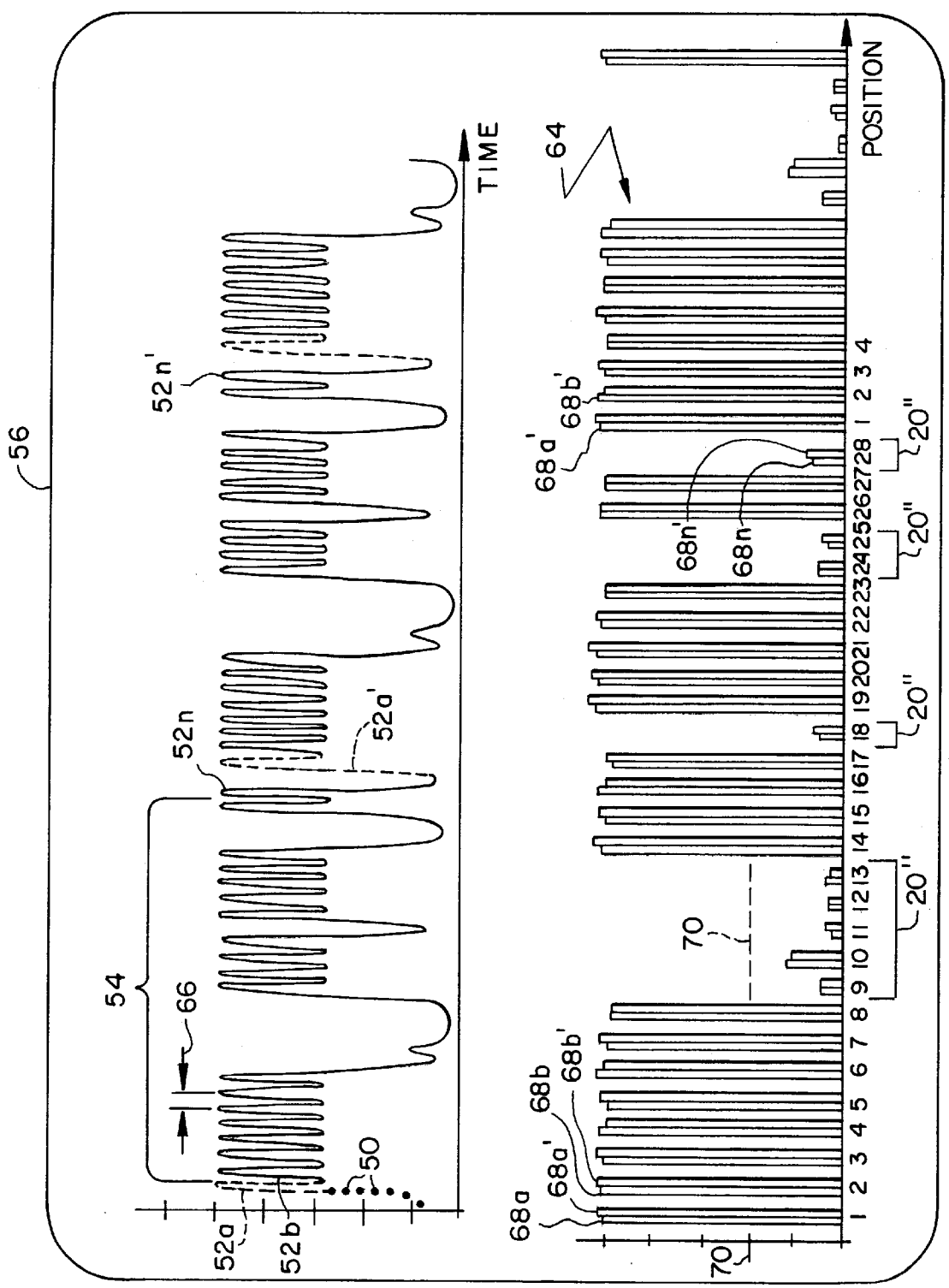
FIG. 2 illustrates a plurality of bar signatures, repeating patterns, and an example of an enhanced visual indication of the impedance of each bar of a tested rotor.

An amp meter or a voltmeter 46 (e.g. a Hewlett Packard model xyz) effectively includes an analog to digital converter 48 and samples the analog voltage (or current) of signal 42 at a predetermined sampling rate. The sampling rate is preferably several times greater than the product of the rotational speed of rotor 10 times the number of bars 20. And the product of the rotational speed of rotor 10 times the number of bars 20 is less than the cyclical frequency of varying magnetic field 24. This allows voltmeter 46 to operate at a predetermined sampling rate that creates several digital signals 50 or values for each bar 20 as rotor 10 rotates, thus providing a plurality of bar signatures (e.g., 52a, 52b, . . . and 52n of FIG. 2) for rotor 10. Together, the plurality of bar signatures 52a–n comprises a digital signature 54 of rotor 10. Digital signals 50 for bars 20 that create the plurality of bar signatures 52a–n and digital signature 54 of rotor 10 can be considered as raw data and, if desired, may be displayed in a table, chart or graphical format on paper or on a monitor screen 56, as shown in the upper half of FIG. 2.

Since the raw data can be difficult to interpret, a microprocessor system 58 (e.g. a computer with the appropriate I/O, microprocessor chip, memory, software, and various other related components) receives the raw data or digital signal 50 at an input 60 (e.g., a serial port) and manipulates the raw data to provide an enhanced visual indication of the rotor condition, such as the impedance or other predetermined characteristic of bars 20. An output 62 conveys the microprocessor-manipulated data to a printer or monitor 56, which displays the information as a bar graph 64, as shown in the lower half of FIG. 2. Bar graph 64 is just one of many examples of an enhanced visual indication. Other examples would include, but not be limited to, various other graphical formats; tables; charts; or accept/reject signals, such as lights or text.

To create an enhanced visual indication, such as bar graph 64, microprocessor system 58 first determines the number of bars 20 that are in rotor 10. If the number of bars is already known, the information can simply be manually inputted to system 58. Otherwise, system 58 analyzes the raw data it receives at input 60 to identify a repeating pattern of bar signatures. To create at least a partially repeating pattern, rotor 10 is rotated more than one revolution. Although between one and two revolutions is possible, rotor 10 is preferably rotated three or four times.

In some embodiments, programmed software of system 58 starts by assuming that rotor 10 has some particular number of bars, say forty. The average pitch or distance 66 between conspicuously clear signal peaks times forty then identifies what may be a full-cycle or complete rotor signature. System 58 then compares that rotor signature to what it considers as the next full-cycle of readings. A close correlation of the two presumably complete cycles indicates that the rotor actually has forty bars. The process is repeated for various other reasonable numbers of bars, such as thirty-nine, thirty-eight, forty-one, forty-two, and so on. The closest correlation helps determine the actual number of bars of an unfamiliar rotor. Of course, system 58 is preferably provided with some additional logic to eliminate unreasonable numbers of bars. For example, it would be very unlikely or unreasonable to suspect that a rotor would have just one or two bars. If rotor 10 is rotated less than two revolutions, system 58 looks for a correlation between the first few bar signatures of the first revolution and the first few bar signatures of the presumed next revolution.

Once the number of bars 20 has been determined, that same number in readings will be taken of the raw data at a pitch that most closely fits a complete rotor signature. And the readings are preferably, but not necessarily, taken at or near each anticipated peak of each bar 20 (i.e., where a peak would normally occur for a good bar). The readings are then displayed as a first set of discrete digital values to create the upper portion of bar graph 64 of FIG. 2. For rotor 10 having twenty-eight bars 20, a corresponding twenty-eight columns 68a, 68b, . . . 68n are displayed. In other words, bar signature 52a corresponds to column 68a, and bar signature 52n corresponds to bar signature 68n. The higher the column, the lower the impedance of the corresponding bar. If desired, additional readings taken beyond the first revolution of rotor 10 can also be displayed as a second set of discrete digital values to indicate the repeatability of the readings. The additional readings are displayed as columns 68a', 68b', . . . 68n'. Here, bar signature 52a' corresponds to column 68a', and bar signature 52n' corresponds to bar signature 68n'. The height similarities of adjacent columns, e.g., columns 68a and 68a', provide the indication of repeatability. As an alternative, the repeatability of the readings could also be indicated by a number, such as a ratio of the heights of columns 68a and 68a'.

In a currently preferred embodiment, valleys 90 between each peak 92 of the raw data are identified and averaged to provide another set of discrete digital values 92a–n that are generally lower than the first set 68a–n taken near the peaks. This lower set of digital values 92a–n are shown underneath their corresponding peak values 68a–n. Comparing their relative values, e.g., 68a/92a, provides a ratio that can be used as accept/reject criteria for each rotor bar 20. A rotor bar 20 may be acceptable if its peak-to-valley ratio is above a predetermined level. In some embodiments the predetermined level is relative in that the acceptable level is chosen based on how a particular ratio of one bar compares to that of the others. With some defective bars, a distinct valley may not even exist. For example, 92n has a value that is virtually the same as 68n.

In some embodiments, rotor analyzer 12 identifies various faults of rotor 10 based on the microprocessor-manipulated data and/or the sampled raw data. For example, one fault may be defined as a bar having an impendence that exceeds a predetermined limit. This is graphically depicted by the columns associated with bars 20″ being below a minimum conductivity limit 70. If desired, such a fault can be distinguished from other predefined conditions or faults, such as a group of bars of relatively poor impendence being unequally distributed about rotor 10.

In some embodiments, system 58 includes a memory 72 that stores digital signature 54 and/or 64 for later reference. Memory 72 is schematically illustrated to represent the wide variety of forms that it can assume, which include, but are not limited to, a hard drive of a computer; a floppy disc; a CD (compact disk); magnetic tape; and an electronic chip, such as RAM, EPROM, or EEPROM. With memory 72, a digital signature taken of rotor 10 when first installed within its stator, can be compared to a later signature taken after rotor 10 has been in operation for a while. The comparison of the two signatures could indicate whether the integrity of rotor 10 deteriorates with use. On a short-term basis, while inspecting a rotor, memory 72 can be used in comparing the set of readings taken during the first revolution of rotor 10 to those of a second revolution, thereby providing an indication of the readings' repeatability.

Although the invention has been described with reference to a currently preferred embodiment, it should be appreciated by those skilled in the art that other variations are well within the scope of the invention. For example, electrical signal 42 is just one example of a signal that varies as a function of induced current 38. Other examples of a signal that varies with current 38 include, but are not limited to, amperage 74 or voltage 76 as provided by amp meter 78 and voltmeter 80, respectively. For voltage signal 76, however, variac 26 or another power supply should be selected so that its output voltage, which it applies across excitation coil 30, preferably decreases with an increase in current through coil 30. An appropriate analog to digital converter 82 converts the analog signal 74 or 76 to a digital signal 50′, which in turn is conveyed to input 60′ or another similar input 60 of microprocessor system 58. System 58 then manipulates signal 50′ in a manner similar to that of signal 50, but with appropriate changes to account for any differences between signals 50 and 50′. By using signal 74 or 76 instead of signal 42, search coil 34 may be omitted. In consideration of such modifications, as well as others that would be obvious to those skilled in the art, the scope of the invention is to be determined by reference to the claims, which follow.

We claim:

1. A rotor analyzer for a rotor having a plurality of bars and being normally associated with a stator, comprising:

a varying magnetic field independent of said stator and projecting into said rotor to induce a current through at least one of said plurality of bars and to create an electrical signal that varies as a function of said induced current;

an analog to digital converter associated with said electrical signal and adapted to provide a digital signal that varies as a function thereof; and a microprocessor system having an input and an output, wherein said input is coupled to receive said digital signal, and wherein said output provides microprocessor-manipulated data that varies as a function of said digital signal to provide an enhanced visual indication of a certain characteristic of said plurality of bars.

2. The rotor analyzer of claim 1, wherein said certain characteristic includes bar impedance.

3. The rotor analyzer of claim 1, wherein said enhanced visual indication allows one fault to be distinguished from another fault, wherein said one fault is at least one of said plurality of bars having a bar impedance that exceeds a predetermined limit.

4. The rotor analyzer of claim 1 further including a device, independent of the stator, for generating the varying magnetic field.

5. The rotor analyzer of claim 1, further comprising an excitation coil adapted to conduct a pulsating current to create said varying magnetic field.

6. The rotor analyzer of claim 5, wherein said electrical signal is said pulsating current.

7. The rotor analyzer of claim 1, further comprising a search coil exposed to a secondary magnetic field created by said induced current.

8. The rotor analyzer of claim 7, wherein said electrical signal is induced within said search coil.

9. The rotor analyzer of claim 1, wherein said analog to digital converter provides a plurality of digital signals for each of said plurality of bars to create a bar signature for each of said plurality of bars, thereby creating a plurality of bar signatures.

10. The rotor analyzer of claim 9, wherein said analog to digital converter provides a plurality of bar signatures in excess of said plurality of bars to create at least a partially repeating pattern of said bar signatures, said microprocessor system determining the number of said plurality of bars of said rotor based upon said at least a partially repeating pattern.

11. The rotor analyzer of claim 1, wherein said enhanced visual indication includes a first plurality of discrete digital values in one-to-one correspondence with said plurality of bars, thereby establishing a digital signature of said rotor.

12. The rotor analyzer of claim 11, further comprising a memory adapted to store said digital signature for later reference.

13. The rotor analyzer of claim 11, wherein said enhanced visual indication includes a second plurality of discrete digital values in one-to-one correspondence with said plurality of bars, whereby said first plurality of discrete digital values and said second plurality of discrete digital values provides an indication of repeatability of said digital signal.

14. A rotor analyzer for a rotor having a plurality of bars and being normally associated with a stator, comprising:

a varying magnetic field independent of said stator and projecting into said rotor to induce a current through at least one of said plurality of bars and to create an electrical signal that varies as a function of said induced current;

an analog to digital converter associated with said electrical signal and adapted to provide a digital signal that varies as a function thereof; and a microprocessor system having an input and an output, wherein said input is coupled to receive said digital signal, and wherein said output provides microprocessor-manipulated data that varies as a function of said digital signal to provide an enhanced visual indication of a certain characteristic of said plurality of bars;

further comprising a drive unit adapted to engage said rotor and adapted to rotate said rotor at a rotational frequency, wherein a product of said rotational frequency times the number of bars of said plurality of bars is less than a cyclical frequency of said varying magnetic field, thereby creating a plurality of digital signals for each of said plurality of bars to create a bar signature for each of said plurality of bars.

15. A rotor analyzer for a rotor having a plurality of bars and being normally associated with stator, comprising:

a device, independent of said stator, projecting a varying magnetic field into said rotor to induce a current to induce a current through at least one of said plurality of bars and to create an electrical signal that varies as a function of the induced current;

an analog to digital converter associated with the electrical signal and adapted to provide a digital signal that varies as a function thereof; and a microprocessor system having an input and an output, wherein the input is coupled to receive the digital signal, and wherein the output provides microprocessor manipulated data that varies as a function of the digital signal to provide an enhanced visual indication of a certain characteristic of the plurality of bars.

* * * * *